United States Patent [19]

Hilford et al.

[11] Patent Number: 4,726,026
[45] Date of Patent: Feb. 16, 1988

[54] FAULT-TOLERANT VOTED OUTPUT SYSTEM

[75] Inventors: Michael H. Hilford, Newport Beach, Calif.; Nathan Tobol, Wrentham, Mass.

[73] Assignee: Triconex Corporation, Irvine, Calif.

[21] Appl. No.: 699,751

[22] Filed: Feb. 8, 1985

[51] Int. Cl.⁴ .............................................. G01R 31/28
[52] U.S. Cl. ........................................... 371/25; 371/15
[58] Field of Search ...................... 371/15, 20, 25, 36; 324/73 R, 73 AT, 73 PC; 364/483

[56] References Cited

U.S. PATENT DOCUMENTS

| | | | |
|---|---|---|---|
| 3,069,562 | 12/1962 | Steele | 307/441 |
| 3,633,016 | 1/1972 | Walker et al. | 371/25 X |
| 3,639,778 | 2/1972 | Cerreghino et al. | 307/441 |
| 4,092,589 | 5/1978 | Chau et al. | 324/73 R |
| 4,365,334 | 12/1982 | Smith et al. | 371/20 X |
| 4,464,722 | 8/1984 | Von Osten | 364/483 |
| 4,497,056 | 1/1985 | Sugamori | 371/25 |

OTHER PUBLICATIONS

Richards, Arithmetic Operations in Digital Computers, D. Van Nostrand Co., Inc., Princeton, N.J., pp. 44, 45.

Primary Examiner—Charles E. Atkinson
Attorney, Agent, or Firm—Lyon & Lyon

[57] ABSTRACT

A majority-voted output circuit generates an output parameter which is the majority vote of its input parameters by series-parallel combination of four intermediate switches, each said switch being a Boolean function of the input parameters, and the circuit being arranged so that failure of any one switch does not affect the value of the output parameter. Alternate embodiments are provided which use "don't care" signals to allow the majority vote of less than the full complement of input parameters. The majority-voted output circuit is subjected to testing by stepped transitions of its input parameters (to test for failure of any of the four intermediate switches) and by forcing current flow through predetermined current paths (to test for failure of a particular electrical connection).

3 Claims, 16 Drawing Figures

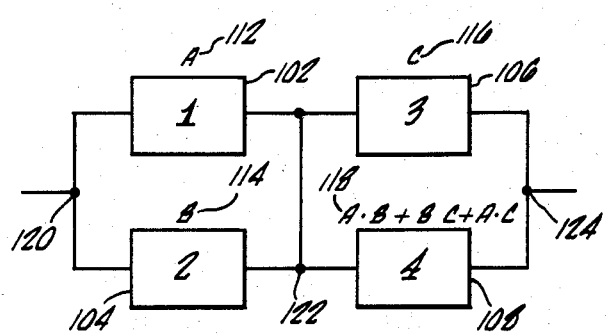
FIG. 1.
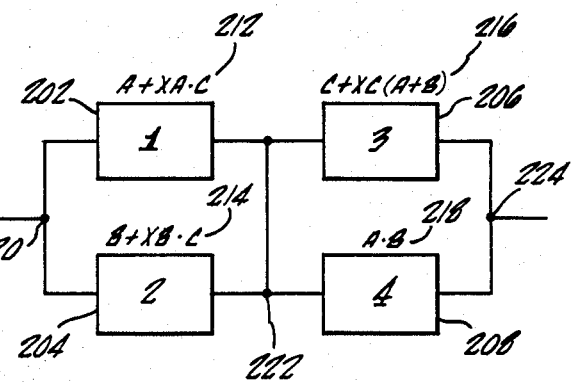
FIG. 2.
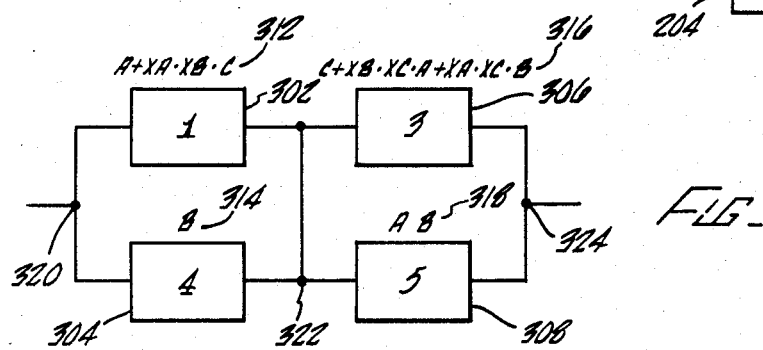
FIG. 3.
FIG. 4.
| TEST NO. | INPUTS | | | OUTPUTS | |
|---|---|---|---|---|---|
| | A | B | C | TRUE | FALSE |
| 1 | FALSE | FALSE | TRUE | 1 OR 2 SHORTED | * |
| 2 | FALSE | TRUE | FALSE | 3 OR 4 SHORTED | * |
| 3 | TRUE | FALSE | TRUE | * | 1 OPEN |
| 4 | FALSE | TRUE | TRUE | * | 2 OPEN |
| 5 | TRUE | FALSE | TRUE | * | 3 OPEN |
| 6 | TRUE | TRUE | FALSE | * | 4 OPEN |
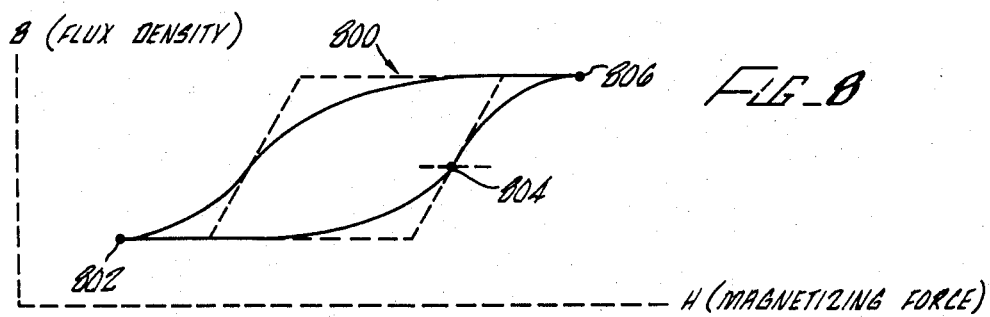
FIG. 8.

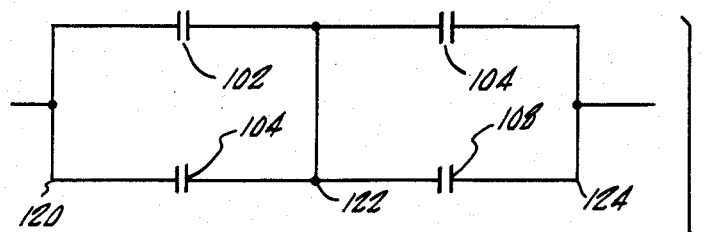
FIG. 5
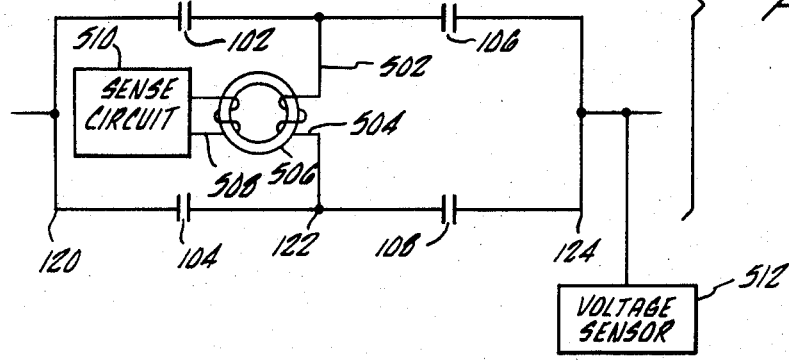
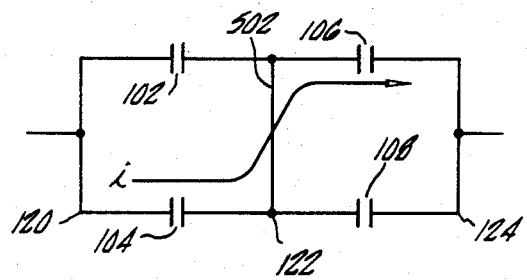
FIG. 6a
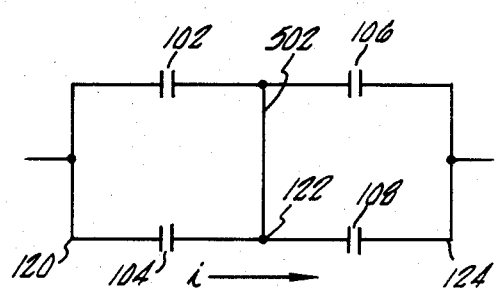
FIG. 6b
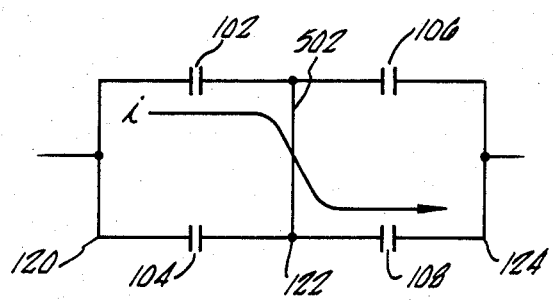
FIG. 6c
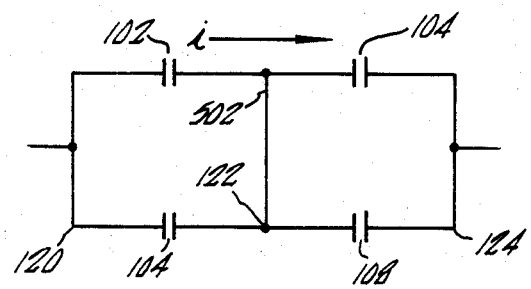
FIG. 6d
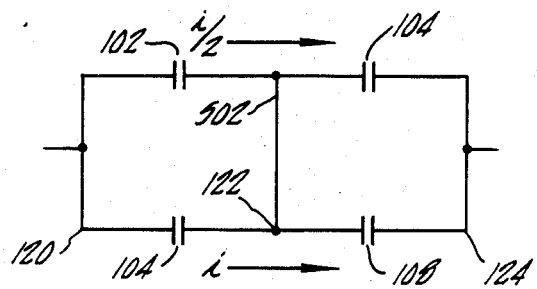
FIG. 6e

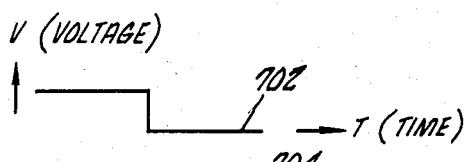
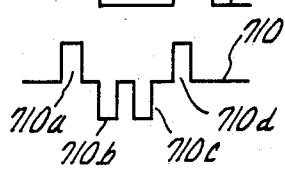
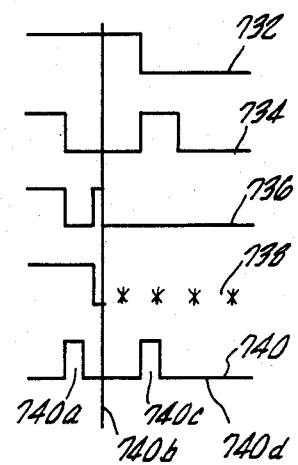
FIG_2a_
FIG_2d_
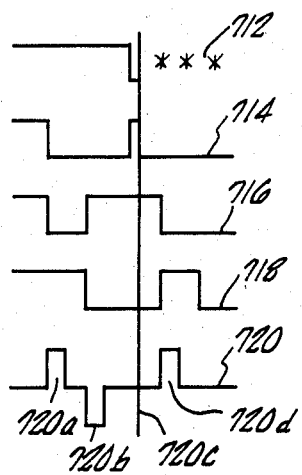
FIG_2b_
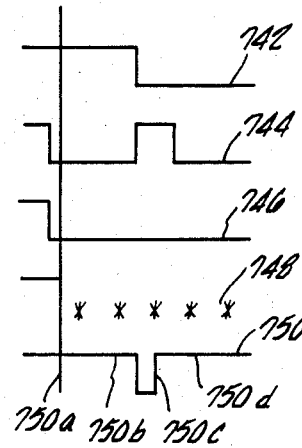
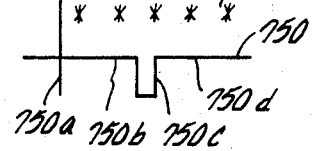
FIG_2e_
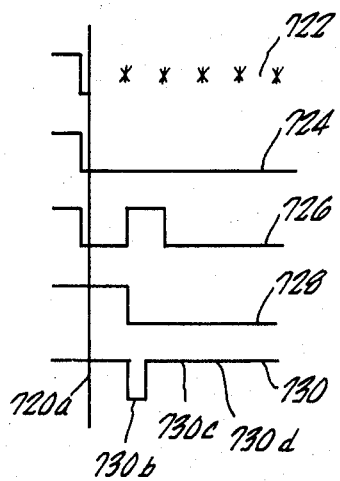
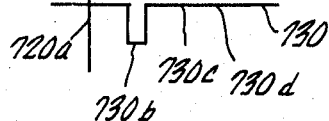
FIG_2c_

FAULT-TOLERANT VOTED OUTPUT SYSTEM

BACKGROUND OF THE INVENTION

1. Field of the Invention

The present invention relates to the field of computer reliability. More specifically, it relates to the field of using separate digital logic modules to produce a majority-vote output result, such that failure of any one logic module or any two input lines will not suffice to "crash" (disable) the system.

2. General Background

Due to their speed and memory, and their ability to attend to small details, computer systems have successfully been employed as process control devices for complex hardware systems (such as the control of a large steel mill) and for multi-transaction bookkeeping operations (such as the day-to-day operations of a large bank). In general, they are faster, more flexible, and less prone to error than a system which uses human operators.

However, computer systems which are used to control critical hardware systems, or which are used to process sensitive data, may still subject their users to the risk of errors (or even system failures), since the computer itself is subject to errors and system failures. It is often necessary to take measures to protect the application system from the risk that its controlling computer will "crash" (cease operation) or that it will generate bad data. Systems which employ these measures are called "fault-tolerant" computer systems.

3. The Prior Art

A common technique used in fault-tolerant systems is to use more than one computing element ("processor"), generating results by their combined operation. An odd number such as three is usually chosen, allowing the combined result to be generated by the majority vote of individual results. Thus, if one processor generates bad results, it will be overruled by the other two and the combined result will still be correct. The combined result is called the "majority-voted output" of the three computing elements.

This method enables the system to continue operation even after one or more of its computing elements has failed, but it does not make the system completely free of failure points. In particular, separating out the computing elements of the system into several units and combining their results by majority vote still leaves the system with a single point of failure—the majority vote mechanism itself. If the voting element is implemented on a single PC board or even a single IC chip, failure of that single element will bring the entire system to a halt. Accordingly, there is a need for majority-voted output systems which are not subject to a single point of failure.

Presently available majority vote logic, due to its implementation in a single circuit, also cannot be tested during system operation. This presents the system operators with the awful choice between unduly relying on this component, or else shutting the system down for maintenance. Accordingly, there is a need for majority-voted output systems which can be modularly tested during active system operation.

4. Objects of the Invention

Therefore, it is an object of the present invention to provide an improved method and device for producing a majority-voted output result, which is not subject to a single point of failure.

It is a second object of the present invention to provide an improved method and device for producing a majority-voted output result, which can be tested while the system is in operation.

It is yet a third object of the present invention to provide an improved method and device for producing a majority-voted output result, which will accept a "don't care" input, so that it will still produce a meaningful result when not all of the input signals are valid.

These and other objects of the present invention will become clear after an examination of the drawings, and the following description.

SUMMARY OF THE INVENTION

In a presently preferred embodiment of the invention, four switches are connected in a parallel-series arrangement so as to convert a set of input digital signals to a derived output digital signal via boolean "OR" and "AND" operations. The four switch values are themselves functions of digital input values supplied by the three computing elements whose results are to be "voted" to produce the voted-output result. The combined boolean function provided by the switches themselves, combined with the parallel-series arrangement of the switches, is just the boolean function of the results of three computing elements which is their majority-voted output result.

If any one of the four switches should fail, either in a open circuit ("stuck zero") or a short circuit ("stuck one") mode of failure, the voted-output result produced by the parallel-series arrangement of switches will not be in error. Thus, the switch arrangement is immune to single-point failures. If any one of the three processors should fail, either by producing bad data or by failing to produce data at all, the voted-output result produced by the series-parallel arrangement of switches will still not change. Thus, the switch arrangement is immune to single-processor failures.

Second and third embodiments are supplied which use two signal inputs from each computing element—a data signal and a "don't care" (data-invalid) signal. If all of the processors think their data is valid, the voted-output result is the same majority-vote result. If any of the processors think their data is not valid, however, the voted-output result will rely only upon the data signals supplied by those processors which remain confident in their data. Thus, the second and third embodiments are immune to simultaneous failure of computing elements, so long as the failed computing elements recognize that their data has become invalid. If any one computing element still works, the system will still operate correctly.

Voltage sensors are used to measure the proper operation of the switches (which are themselves combined in a parallel-serial arrangement). Whenever the logical output of the multiprocessor system changes, a transition of input parameters will occur which should cause that change in the output parameter. The input parameters are altered one-by-one, while the output parameter is monitored to determine that the circuit generates the proper majority-voted output result. A table is consulted to pinpoint the single point of failure if an error occurs. Similarly, a current sensor is used to measure the proper connectivity of the circuit; input parameters and switches are set so as to force an expected current through a known circuit path, while the actual current is measured.

SUMMARY OF THE DRAWINGS

FIG. 1 is an arrangement of switches for a first embodiment of the present invention.

FIG. 2 is an arrangement of switches for a second embodiment of the present invention.

FIG. 3 is an arrangement of switches for a third embodiment of the present invention.

FIG. 4 is a table of test value inputs and outputs for the present invention.

FIG. 5 shows the placement of a current sensor device for the central bridge connector.

FIGS. 6a–6e show the current flows which are induced in the circuit to test the switches.

FIGS. 7a–7e show the current flows which are measured by the sensor device when the switches are tested.

FIG. 8 shows the hysteresis loop characteristic of the magnetic state of a soft iron core used in the current sense circuit.

DETAILED DESCRIPTION

Referring now to FIG. 1, a first embodiment of the present invention is disclosed. This embodiment implements a simple fault-tolerant majority-voted output system, with three inputs (A, B, and C) and one output path.

In the drawing, each box 102–108 represents a boolean switch which may take on the values "true" or "false," i.e., may be open or closed. For example, when box 102 is "true" the connection between nodes 120 and 122 is complete, but if box 102 is "false" the connection between these two nodes remains open.

In the drawing, each formula 112–118 associated with each box 102–108 represents some function of parameters (which are input to the voted-output system) which that particular switch implements. For example, if box 102 implements the formula "A," then that switch will be "true" whenever A is "true" and false otherwise. The values "A," "B," and "C" are the input parameters from the three processors.

It is seen that when switches are arranged in parallel, as are boxes 102 and 104, the formula computed by their parallel arrangement is the boolean OR of the formulas computed by the individual switches. Thus, the connection between nodes 120 and 122 represents the boolean OR of the values of box 102 and 104, and the connection between nodes 122 and 124 represents the boolean OR of the values of box 106 and 108.

It is also seen that when switches are arranged in serial, as are boxes 102 and 106, the formula computed by their serial arrangement is the boolean AND of the formulas computed by the individual switches. Thus, the connection between nodes 120 and 124 represents the boolean AND of the values represented by the connections between first nodes 120–122, and second nodes 122–124.

Thus the complete value computed by the circuit of FIG. 1 is the boolean function $(B_{102} \vee B_{104}) \& (B_{106} \vee B_{108})$, which is the exact logical formulation of a majority-voted output. As used herein, "&" means logical-AND; "v" means logical-OR. It is also seen that if any one of the four switches 102–108 is replaced with an open circuit (called a "stuck-zero error," because the switch is stuck with a boolean value of zero ("false")) or with a short circuit (called a "stuck-one error," for similar reasons), the voted-output result will remain the same.

Because the voted-output result remains the same even if one of the boolean switches has failed, the system is immune to single-switch failures. It is therefore also possible to remove single switches for testing while the system is in operation. Also, because the voted-output result remains the same even if one of the processor inputs has failed, the system is immune to single-processor failures as well.

Referring now to FIG. 2, a second embodiment of the present invention is disclosed. This embodiment implements a fault-tolerant majority-voted output system, with three inputs and one output, and with data-invalid ("don't care") inputs.

In the drawing, as in FIG. 1, each box 202–208 represents a boolean switch, and each formula 212–218 associated with each box 202–208 represents some function of parameters which that particular switch implements. The values "XA," "XB," and "XC" are the "don't care" input parameters from the three processors; they indicate for each processor if that processor has failed and its data is no longer valid. The voted-output system attempts to form its majority from the votes of processors with valid data only. Accordingly, the values "A," "B," and "C" are the input parameters from the three processors, boolean-ANDed with the inverse of its data-invalid value, thus $A_{new} = A_{old} \& (XA')$. As used herein, "XA'" means the logical inverse of XA. Similarly, "XB'" means the logical inverse of XB, and "XC'" means the logical inverse of XC. This is not shown in FIGS. 2 and 3 for clarity.

It is seen that the circuit of FIG. 2 also computes the exact logical formulation of a majority-voted output, when all three processors have valid data. When any one or two processors have invalid date (their "don't care" values are on), the circuit of FIG. 2 computes the proper voted-output for a majority of the remaining processors. It is also seen that, as in FIG. 1, if any one of the four switches 202–208 is replaced with an open circuit or with a short circuit the voted-output result will remain the same.

It is seen that, as in FIG. 1, because the voted-output result remains the same even if one of the boolean switches has failed, the system is immune to single-switch failures. It is also seen that, as in FIG. 1, because the voted-output result remains the same even if one of the processor inputs has failed, the system is immune to single-processor failures as well. Since the circuit of FIG. 2 computes the proper voted-output even when one or two processors have invalid data (they have failed), the system is immune to double-processor failures as well, so long as the processor can set its own "don't care" value when it fails.

Referring now to FIG. 3, a third embodiment of the present invention is disclosed. This embodiment implements a fault-tolerant majority-voted output system, with three inputs and one output, and with data-invalid ("don't care") inputs. It resolves all "tie votes" to an output result of "false," unlike the circuit of FIG. 2, for which the result is dependent on the identity of the tied voters.

In the drawing, as in FIG. 1, each box 302–308 represents a boolean switch, and each formula 312–318 associated with each box 302–308 represents some function of parameters which that particular switch implements. As in FIG. 2, the values "XA," "XB," and "XC" are the "don't care" input parameters from the three processors, and each value "A," "B," and "C" is boolean-ANDed with the inverse of its "don't care" value; the voted-output system attempts to form its majority from the votes of processors with valid data only.

It is seen that, as in FIGS. 1-2, the circuit of FIG. 3 also computes the exact logical formulation of a majority-voted output, when all three processors have valid data. When any one or two processors have invalid data (their "don't care" values are on), the circuit of FIG. 3 computes the proper voted-output for a majority of the remaining processors. It is also seen that, as in FIGS. 1-2, if any one of the four switches 302-308 is replaced with an open circuit or with a short circuit the voted-output result will remain the same.

It is seen that, as in FIGS. 1-2, because the voted-output result remains the same even if one of the boolean switches has failed, the system is immune to single-switch failures. It is also seen that, as in FIGS. 1-2, because the voted-output result remains the same even if one of the processor inputs has failed, the system is immune to single-processor failures as well. Since, as in FIG. 2, the circuit of FIG. 3 computes the proper voted-output even when one or two processors have invalid data (they have failed), the system is immune to double-processor failures as well, so long as the processor can set its own "don't care" value when it fails.

Referring now to FIG. 4, test values for input and output parameters for the present invention are disclosed.

It is desirable to test the four switches 102-108 (or 202-208, or 302-308) periodically to determine if any one or more of them has failed. Testing is performed by presenting inconsistent input parameters to the parallel-serial arrangement, and looking at the output results to see if the voted-output result is correct.

Though the system is immune to single-processor failures, and it is immune to single-switch failures, it is not necessarily immune to a simultaneous failure of both a processor and a switch. Thus, if one processor's data is deliberately input incorrectly, the parallel-serial switch arrangement will only generate incorrect output if one of the switches has failed.

The test is performed on any transition (i.e., true-to-false or false-to-true) of the intended output value, and presumes that all of the processors are working properly. Rather than changing all three processors' output from "true" to "false" at once, a stepped transition is made by changing first one, then a second, and lastly the third. In this way, each of the tests outlined in the table may be performed.

The table indicates six test combinations 1-6 which are used. Each test combination requires that the three input parameters are set as shown; whereupon the expected-output state (shown by an asterisk) will appear at the output. If the other state appears instead, an error has occurred - one or more of the switches has failed, as shown in the error-source tag. Note that the expected-output state is "false" for some test combinations (1-2) and "true" for others (3-6).

In a present embodiment of the invention, it is preferred to apply the test combinations whenever a transition is made from one output value to another. The test combinations 3-6 and one of the set 1-2 may be applied for true-to-false transitions; and the test combinations 1-2 and one of the set 3-6 may be applied for false-to-true transitions. The sequence of test combinations should be aborted if at any time an error state is encountered, to avoid introducing spurious transitions into the output.

Referring now to FIG. 5, the placement of voltage and current sensor devices is disclosed.

The test values disclosed with reference to FIG. 4 are measured by a load voltage sensor 512, which detects the output voltage produced at node 124. This output node may be connected to a load peripheral (not shown), and the voltage sensor result fedback to a system controller (not shown). The voltage sensor's feedback from the junction of the majority-vote circuit and the load peripheral allows the system controller to determine that the majority-vote circuit is working properly and that the power supply is properly connected to the load.

In addition to the voltage tests which are performed, several current feedback tests may also be performed to test the voter switches. The central bridge, 502 (whose voltage is that of node 122) is measured for current flows which pass between the four switches 102-108. Current through the bridge is measured by attaching a primary winding 504 to a soft iron core 506, and attaching the soft iron core to a secondary winding 508, which is connected to an electrical sensor circuit 510. Any current flow through the bridge will cause a secondary current to be generated in the secondary winding, which can be measured and reported by the sensor circuit.

A conductive wire (not shown) passed through the center of the soft iron core 506 can be used to reset the core to a known magnetic state. This process is disclosed with reference to FIG. 8, showing a hysteresis loop 800. A momentary current through the wire is used to perform the reset; it is of sufficient magnitude to initialize the core into hysteresis position 802, overriding any current flowing through the central bridge 502.

After the soft iron core 506 is initialized to position 802, current passing through the majority-vote circuit to the load will result in a hysteresis position 804. A current can then be passed through the conductive wire (not shown) which will cause the soft iron core to return to hysteresis position 802. This event can be sensed by the sense circuit 510 to provide an indication of the existence of current flowing to the load peripheral (not shown). If no current is flowing to the load peripheral, the reset operation will not cause any change in the hysteresis state, and the sense circuit will detect no current.

Referring now to FIGS. 6a-6e, the current flows which are induced in the circuit are disclosed.

Additional Boolean circuitry (not shown) can be easily added to allow the circuit tester to force each of the switches 102-108 either "on" or "off." When it is "on," a switch will conduct current, but when it is "off," it will not. By forcing individual switches on or off, and applying a known voltage at nodes 120 and 124, current can be made to flow through the central bridge 502.

Thus, when switches 104 and 106 are set on, and switches 102 and 108 are set off (FIG. 6a), current should flow through the bridge 502. But when switches 104 and 108 are set on, and switches 102 and 106 are set off (FIG. 6b), no current flows through the bridge. Again, when switches 102 and 108 are set on, and switches 104 and 106 are set off (FIG. 6c), current should flow through the bridge. But when switches 102 and 106 are set on, and switches 104 and 108 are set off (FIG. 6d), no current flows through the bridge. In the steady state where all switches are set on (FIG. 6e), no current should flow through the bridge —and each switch should carry less than the maximum current load.

Referring now to FIGS. 7a-7e, measurement of the induced current flows is disclosed.

FIG. 7a shows the error-free case. When output switches are sequenced as in FIGS. 6a-6d, current flow should appear across each switch as it is opened (turned "on") or closed (turned "off"); this is seen for switch 104 in trace 704, for switch 108 in trace 708, for switch 102 in trace 702, and for switch 106 in trace 706. The current flow sensed across the connector 502, shown in trace 710, will exhibit changes for each change in the switch settings, shown at trace elements 710a-d.

FIG. 7b shows the sensor response when one of the switches (102) exhibits a stuck-one failure, i.e., it becomes permanently open. The current flow changes across the bridge 502, shown in trace 720, will not include a change for one of the switch setting changes, shown at trace elements 720a-d. Note that trace element 720c is absent, and that this absence is mirrored in abnormal responses in the traces for switch 104 (trace 714) and for switch 102 (trace 712).

Similarly, FIGS. 7c-7e show the sensor response for other types of failure. In each failure mode, one or more of the trace elements (730a and 730c-d, 740b and 740d, 750a-b and 750d) for the current flow sensed across the bridge 502 (traces 730, 740, and 750) will be absent, and that absence will be mirrored in abnormal responses in the switch traces. These sensed responses will be measurable and allow the sensor to detect and locate errors in the voted-output system.

It should be remembered that while a presently preferred embodiment has been disclosed, variations are possible which remain within the scope of the present invention.

We claim:

1. In a majority-vote output circuit for accepting a plurality of input logical values as input parameters, at least one of said input logic values being presented as a plurality of equal valued input parameters, and for generating one output logical value as an output parameter, a method for testing components of the circuit, comprising the steps of:

(a) awaiting a transition in input parameters which would generate a change in the output parameter;
 (b) successively altering each single input parameter of a set input parameters representing a single input logic value from its pre-transition value to its post-transition value;
 (c) successively checking the resultant output parameter after each input parameter alteration against its expected value; and
 (d) generating a signal to indicate an error condition if any actual resultant output parameter does not match the corresponding expected resultant output parameter.

2. In a majority-vote output circuit, having a plurality of logic switches, for accepting a plurality of logical values as input parameters and for generating one logical value an an output parameter, a method for testing a current path in the circuit, comprising the steps of:

(a) applying control signals to at least one of said logic switches which would force an expected current through a predetermined circuit path;
 (b) measuring the actual current which passes through the predetermined circuit path; and
 (c) generating a signal to indicate an error condition if the actual measured current differs from the expected measured current by more than an acceptable limit.

3. In a majority-vote output circuit for accepting a plurality of input logical values as input parameters, at least one of said input logical values being presented as a plurality of equal valued input parameters, and for generating at least one output logical value as an output parameter, a method for testing components of the circuit, comprising the steps of successively altering each single input parameter of a set of input parameters representing a single input logic value from its pre-transition value to its post-transition value;
 successively checking the resulted output parameter each input parameter alteration against its expected value; and
 generating a signal to indicate if any actual resultant output parameter does not match the corresponding expected resultant output parameter.

* * * * *